United States Patent [19]

Hildebrand et al.

[11] Patent Number: 4,593,390
[45] Date of Patent: Jun. 3, 1986

[54] PIPELINE MULTIPLEXER

[75] Inventors: David B. Hildebrand, Bedford, Tex.; David E. Karoly, Colorado Springs, Colo.

[73] Assignee: Honeywell, Inc., Phoenix, Ariz.

[21] Appl. No.: 639,171

[22] Filed: Aug. 9, 1984

[51] Int. Cl.$^4$ .............................................. H04J 3/02
[52] U.S. Cl. .................................. 370/112; 307/243; 328/104
[58] Field of Search ....................... 370/112; 307/243; 328/104, 154

[56] References Cited

U.S. PATENT DOCUMENTS

| | | | |
|---|---|---|---|
| 3,586,985 | 6/1971 | Schoendorff | 328/154 |
| 3,614,327 | 10/1971 | Low | 370/112 |
| 3,681,614 | 8/1972 | Kroos | 307/243 |
| 4,354,266 | 10/1982 | Cooperman et al. | 370/112 |
| 4,453,096 | 6/1984 | LeCan et al. | 307/243 |
| 4,486,880 | 12/1984 | Jeffery et al. | 307/243 |

Primary Examiner—Douglas W. Olms
Attorney, Agent, or Firm—A. A. Sapelli; J. S. Solakian; A. Medved

[57] ABSTRACT

A pipelined multiplexer is provided for selecting one-of-m input signals, comprising N stages of select elements, each stage of the select elements including $2^n/2$ select gates, where n is the stage number. Each select gate has two input terminals and one output terminal for selecting one of two input signals from the input terminals. The selection of an input signal is in response to a corresponding select control signal and the outputting of the respective selected signal is in response to a clocking signal.

1 Claim, 9 Drawing Figures

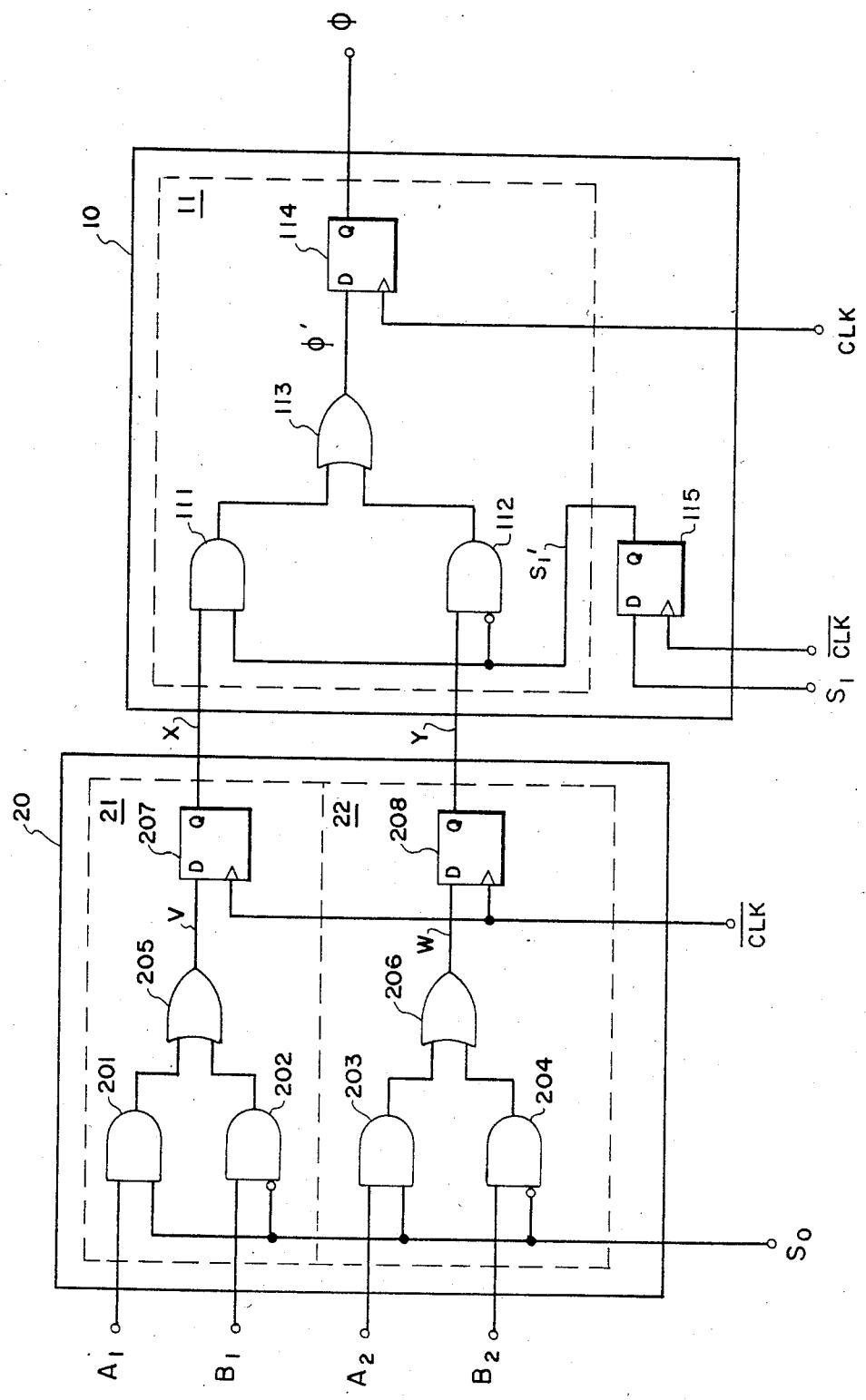
F I G. 2

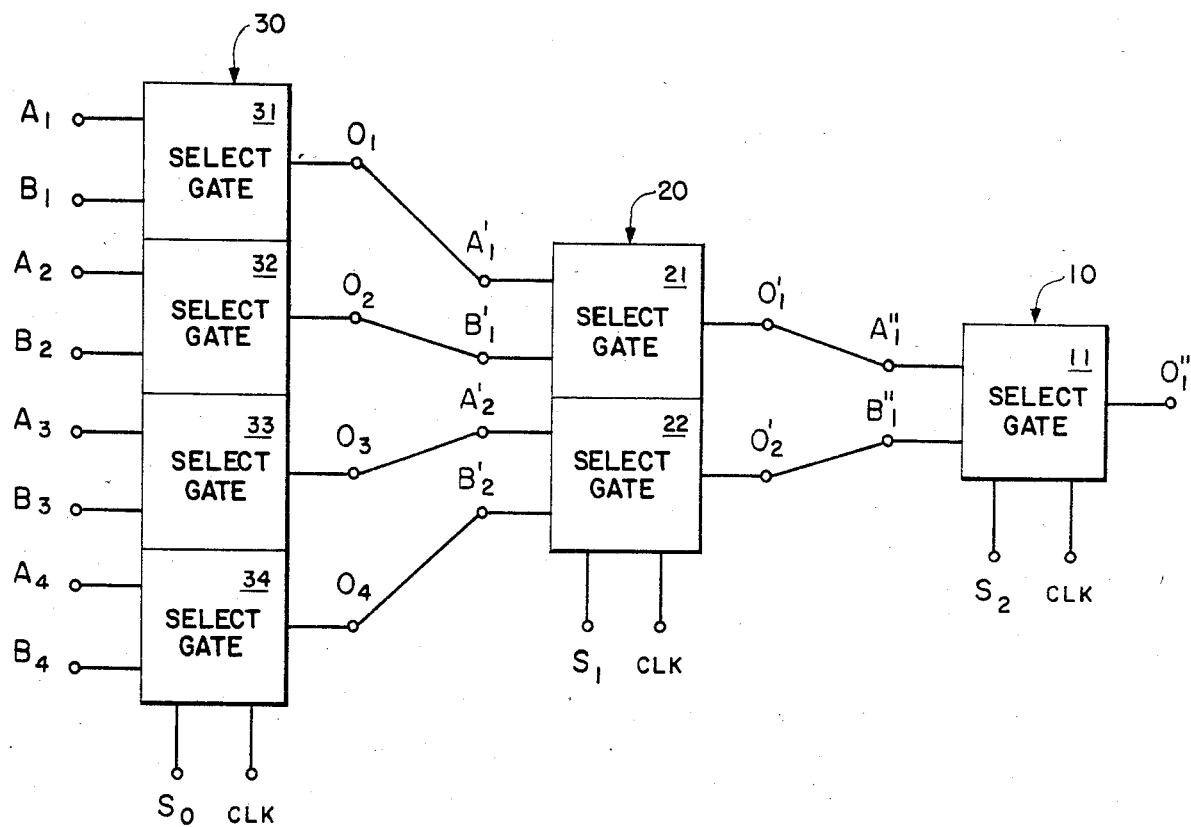
F I G. 4

4,593,390

PIPELINE MULTIPLEXER

RELATED PATENT APPLICATIONS

This invention may be employed in the transmission systems such as that disclosed in U.S. patent application Ser. No. 591,292, filed Mar. 19, 1984 now U.S. Pat. No. 4,536,873 entitled "A data Transmission System", by Tom Leete, and U.S. patent application Ser. No. 586,154, filed Mar. 5, 1984, entitled "A Sequential Data Transmission System", by Tom Leete, both applications assigned to the same assignee as the present application.

BACKGROUND OF THE INVENTION

This invention relates to devices for signal selecting, and more particularly, to a multiplexer having a pipeline structure.

Multistage tree type multiplexers have the disadvantage that each stage adds additional capacitive loading as well as adding unknown and variable amounts of propagation delay. As a result, in current multiplexers, it may be indeterminable which clock the data is associated with. The present invention overcomes the above mentioned disadvantages for a digital multiplexer by providing a latch at each stage of switching. The latch buffers the input signal, provides restored logic levels at each stage, fixes the delay per stage at the clock period used to clock the latches, and provides a new data bit each clock period.

Thus, the present invention has a fixed delay, i.e. a known delay even though the propagation delay time for selecting a signal through the multiplexer may be increased. Further, the present invention has the advantage of reducing drive requirements by including the latches between stages. The drive requirements of the present invention is one gate level plus the latch, instead of the summation of all the capacitance of all the stages as required by current multiplexers. Data throughput of conventional tree type multiplexers is governed by the propagation delay through the entire tree. However, data throughput of the present invention is limited only by the propagation delay of a single stage. Once the "pipeline" is filled with data (after N clock pulses), new data is output at every clock period.

SUMMARY OF THE INVENTION

Therefore, there is provided by the present invention, a pipeline multiplexer for selecting one-of-m initial input signals which comprises n stages of select elements, where n is the stage number from 1 to N, the Nth stage being an input stage and the first stage being an output stage. Each stage of the select elements includes $2^n/2$ select gate elements, each select gate element having two input terminals adapted to receive an input signal and one output terminal, each select gate element for selecting one of two input signals from the input terminals to couple the selected input signal to the output terminal. Each select gate element of a predetermined stage of the select elements is responsive to a select control signal. Each output terminal of an ith stage of the select elements is operatively connected to a preselected input terminal of an $i-1$ stage of the select elements, where i is a whole number having a value between N and 2 inclusive. The input terminals of the Nth stage of the select element each receives one of the initial input signals, and the first stage of the select elements has a single output terminal thereby outputting the selected one-of-m initial input signals. Further, each stage of the selected elements outputs their respective selected signals in response to a clocking signal.

Accordingly, it is the object of the present invention to provide a device having a pipeline structure for selecting one of m input signals.

It is another object of the present invention to provide a device having a pipeline structure for selecting one of m input signals in response to at least one control signal.

It is still another object of the present invention to provide a device having a pipeline structure for selecting one of m input signals having a known propagation delay.

It is still a further object of the present invention to provide a device having a pipeline structure for selecting one of m input signals in response to at least one control signal having a known propagation delay determinable from a clocking signal.

These and other objects of the present invention will become more apparent when taken in conjunction with the following description and attached drawings, wherein like characters indicate like parts, and which drawings form a part of the present application.

BRIEF DESCRIPTION OF THE DRAWINGS

FIG. 2 shows a logic diagram of the two-stage pipeline multiplexer of FIG. 1;

FIG. 4 shows a block diagram of a three-stage pipeline multiplexer of the present invention;

DETAILED DESCRIPTION

Figure 1:
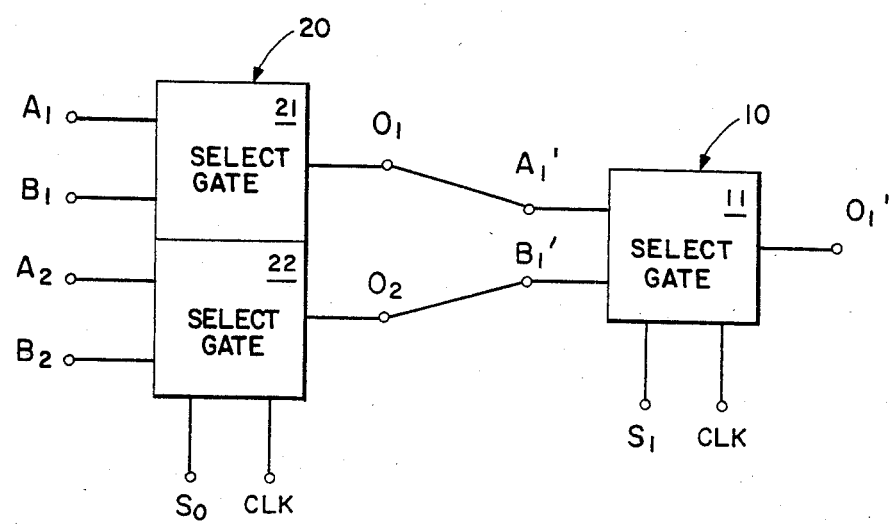
FIG. 1 shows a block diagram of a two-stage pipeline multiplexer of the present invention.

Referring to FIG. 1 there is shown a block diagram of a two-stage pipeline multiplexer of the present invention. The pipeline multiplexer is a four-to-one multiplexer, i.e., of four input signals one is selected for output in response to control signals, S0 and S1. Pipeline multiplexer of FIG. 1 comprises a first stage 10, and a second stage 20. The first stage 10 comprises a single select gate 11 and the second stage 20 has two select gates 21, 22, each select gate having the same logic configuration and will be described in further detail hereinunder. Each select gate has two inputs A, B, and one output. Hence, second stage 20 has four inputs $A_1$, $B_1$, $A_2$, $B_2$, and two outputs $O_1$, $O_2$, and first stage 10 has two inputs $A_1'$, $B_1'$, and one output $0_1'$, the two outputs of second stage 20, $O_1$, $O_2$, being operatively coupled to the input terminals $A_1'$, $B_1'$ of first stage 10 respectively.

The four input terminals of second stage 20 each receive an input signal; hence, second stage 20 is the denoted the input stage. The one output terminal $O_1'$ of first stage 10 outputs the one selected signal; hence, first stage 10 is the denoted the output stage.

Referring to FIG. 2 there is shown a logic diagram of the two stage pipeline multiplexer of FIG. 1. Each select gate 11, 21, 22, comprises a first two-input AND gate 201, 203, 111, and a second two-input AND gate 202, 204, 112. The first input of the first AND gate 201, 203, 111 is coupled to the input signal terminal $A_1$, $A_2$, $A_1'$, respectively. The second input of the first AND gate 201, 203, 111, is coupled to a terminal adapted to receive the corresponding control signal $S_0$, $S_1$. The first input of second AND gate 202, 204, 112, is coupled to the second input signal terminal $B_1$, $B_2$, $B_1'$, respectively. The second input of second AND gate 202, 204, 112, is an inverting input and is coupled to receive a corresponding control signal $S_0$, $S_1$. For select gate 21, the output of first 2-input AND gate 201 and the output of second 2-input AND gate 202 is operatively coupled to an OR gate 205, which in turn has its output coupled to the input of a latch 207. Likewise for select gate 22, 11, the output of each first 2-input AND gate 203, 111, and the output of each second 2-input AND gate 204, 112, is operatively coupled to a corresponding OR gate 206, 113, which in turn has its output coupled to a corresponding input of a latch 208, 114. The output of the latch 207, 208, 114 is operatively coupled to the output terminal $O_1$, $O_2$, $O_1'$ of the respective select gate 21, 22, 11.

Figure 3:
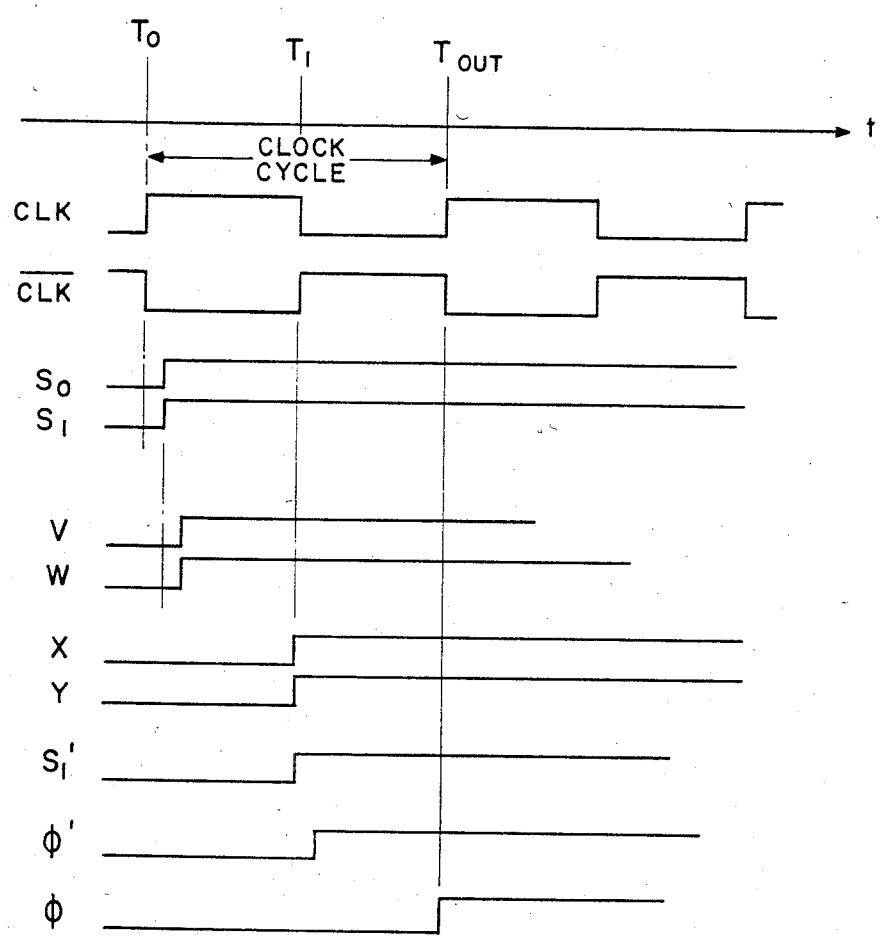
FIG. 3 shows a timing diagram of the two-stage pipeline multiplexer of FIG. 2.

The operation of the two-stage pipeline multiplexer will now be described in conjunction with FIG. 2 and FIG. 3. FIG. 3 shows a timing diagram of the two-stage multiplexer of FIG. 2. At initial time $T_0$, it is assumed that the input signals at input terminals $A_1$, $A_2$, $B_1$, $B_2$, are stable. (Note that the input signals are referred to herein by the input terminal designation, e.g., input signal $A_1$, input signal $B_1$, . . .) It is assumed for purposes of example herein that the input signals $A_1$, $A_2$, $B_1$, $B_2$, and the control signals are all at a logic one level (or high) in order to observe the signal switching and selecting process.

Control signals $S_0$ and $S_1$ go high shortly after the initial time $T_0$, thereby enabling the first two-input AND gates 201, 203, causing the output signals V and W of OR gates 205, 206 to go high two gate time delays after $S_0$, signals V and W corresponding to input signals $A_1$ and $A_2$, respectively. At time $T_1$, when $\overline{CLK}$ goes high, signals V and W are latched by latches 207, 208. The corresponding outputs, signals X and Y, go high, the signals X and Y corresponding to input signals $A_1$ and $A_2$, respectively. The output signals X and Y thus constitute the input signals to the next stage, i.e. in this case first stage 10.

In order that the desired data switching occur, the control inputs to each stage of the multiplexer must each be delayed an amount approximately equal to the delay encountered by the data in reaching the stage of the multiplexer. Such delays are readily accomplished using latches. The design thus fixes the data delay to a known relationship to the clock output and once the initial bit of data is output, data can be output in a continuous stream at the clock rate. It will be recognized by those skilled in the art that other techniques from that implemented in the preferred embodiment of the present invention can be utilized to achieve the necessary delay of the control signals.

Since control signal $S_1$ is high at time $T_1$, at which time $\overline{CLK}$ switches and goes high, control latch 115 outputs signal $S_1'$ which enables the first 2-input AND gate 111 or the second 2-input AND gate 112 of select gate 11. In this example, since $S_1$ is a logic one, thereby causing signal $S_1'$ to be a logic one, only first 2-input AND gate 111 is enabled thereby selecting signal X. Signal X is then transmitted through OR gate 113, denoted as signal $\phi'$. Signal $\phi'$ occurs essentially two gate time delays after signal $S_1'$. Signal $\phi'$ is then latched into latch 114 during the positive slope of the clock signal, CLK, causing the selected output signal $\phi$, corresponding to input signal $A_1$, to occur at terminal $O_1'$ which occurs at time $T_{out}$.

Although the above example is directed to a two-stage pipeline multiplexer, the following example can be extended to n stages, where n as a positive whole number.

Referring to FIG. 4, there is shown a block diagram of a three-stage pipeline multiplexer. Pipeline multiplexer comprises a first stage 10, a second stage 20, and a third stage 30. First stage 10 includes a select gate 11, and second stage 20 includes two select gates 21, 22, as described above in conjunction with the two-stage pipeline multiplexer. The third stage 30 includes four select gates 31, 32, 33, 34, each select gate having two inputs A, B and one output O, as described above. Hence, the third stage 30 has a total of eight inputs and four outputs, the four outputs being operatively connected to the four inputs of the second stage 20. The three stage pipeline multiplexer is an 8-to-1 multiplexer, i.e., the three stage pipeline multiplexer selects one of eight inputs signals, and further requires an additional control signal over the two-stage pipeline multiplexer. Namely, three control signals are utilized in three stage pipeline multiplexer, $S_0$, $S_1$, and $S_2$.

Figure 5:
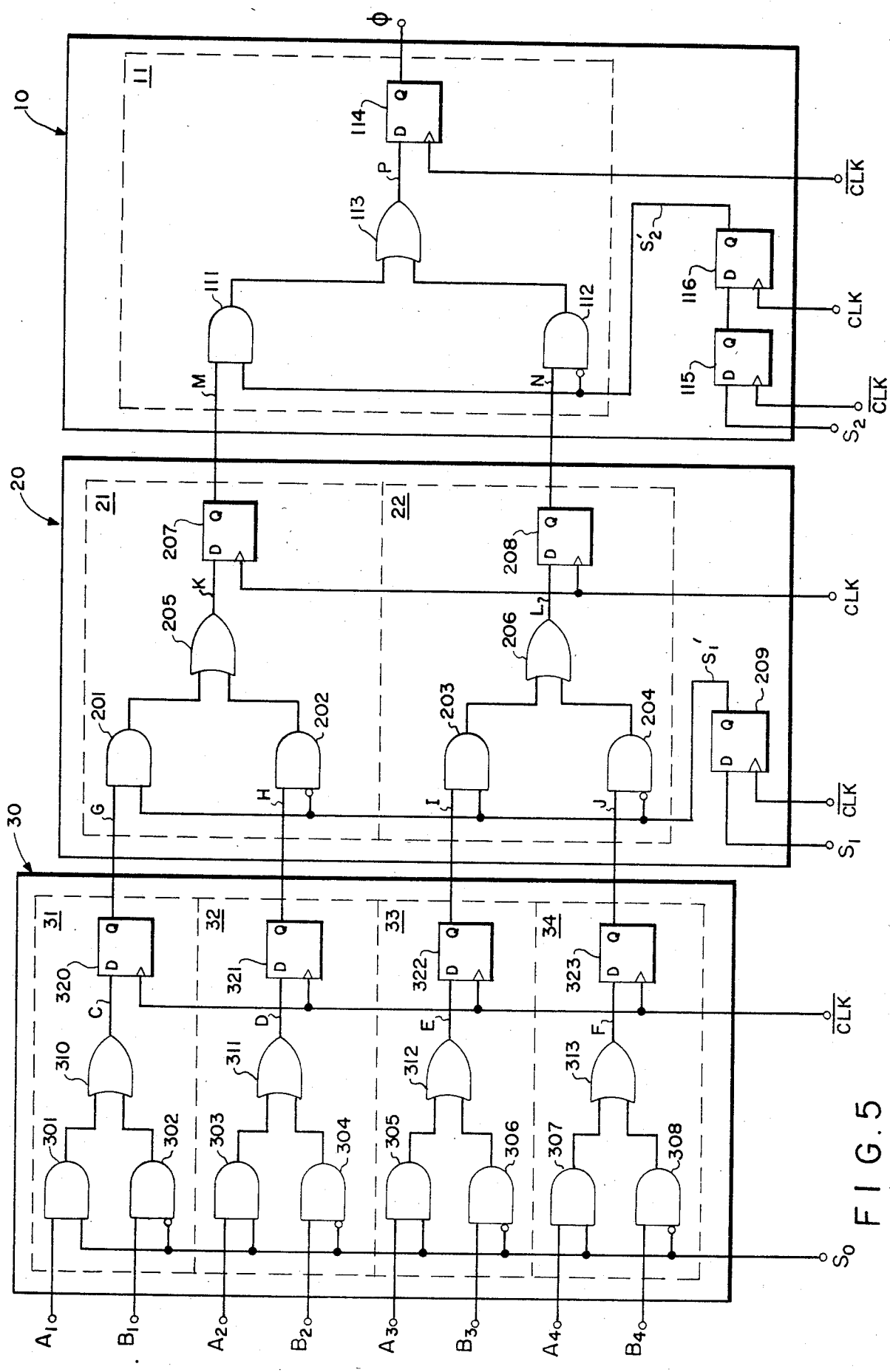
FIG. 5 shows a logic diagram of the three-stage pipeline multiplexer of FIG. 4.
Figure 6:
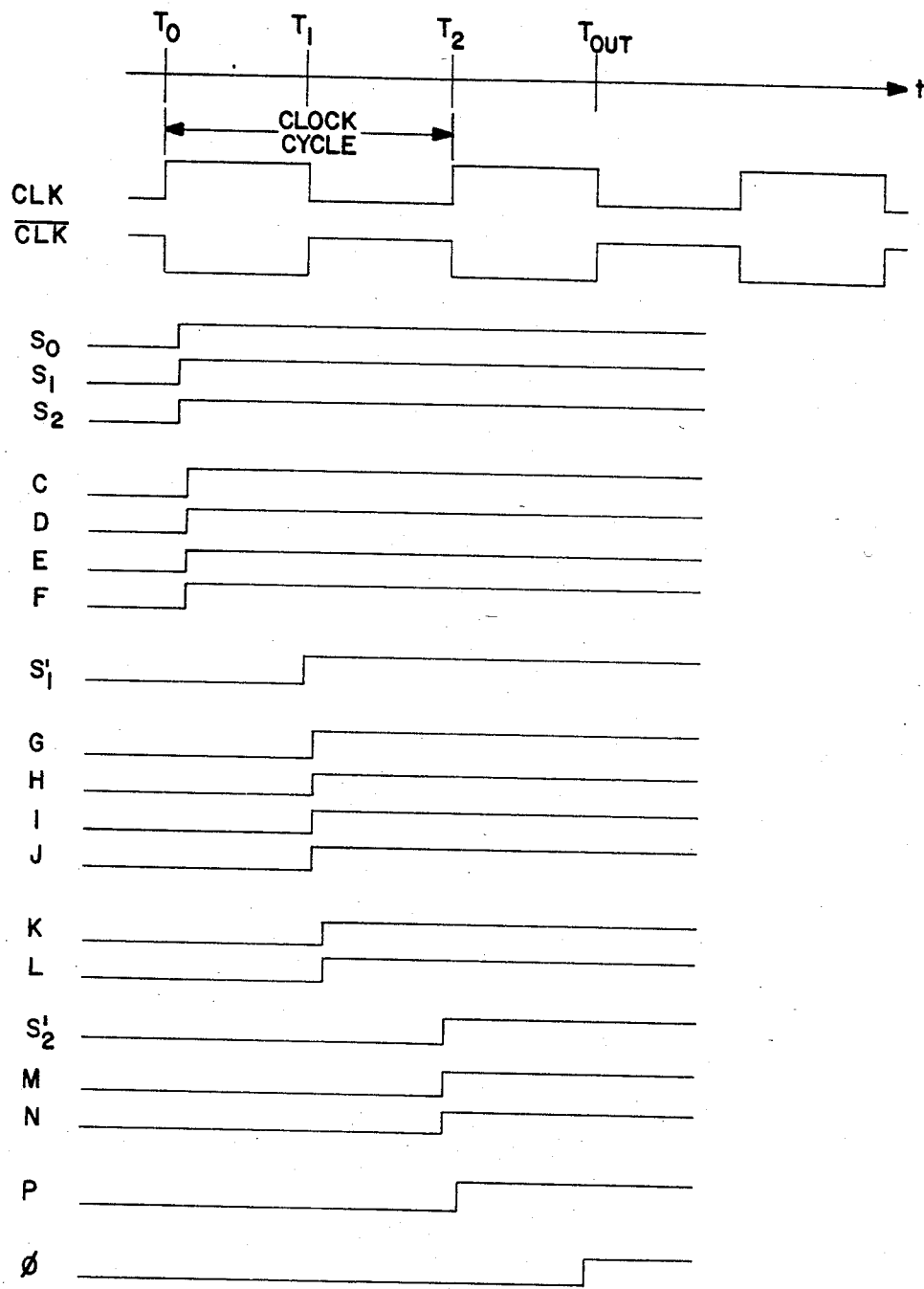
FIG. 6 shows a timing diagram of the three-stage pipeline multiplexer of FIG. 5.

The operation of the three stage pipeline multiplexer will now be described, in conjunction with FIG. 5, which shows a logic diagram of the three stage pipeline multiplexer, and in conjunction with FIG. 6, which shows a timing diagram of the three stage pipeline multiplexer. At initial time $T_0$ the eight input signals $A_1$, $A_2$, $A_3$, $A_4$, $B_1$, $B_2$, $B_3$, $B_4$, should be present at the respective input terminals and be stable. (Note all the input signals and control signals are shown at a logic one, or high, in order to show the signal propagation in this example.) Control signals $S_0$, $S_1$, and $S_2$ go high shortly after initial time $T_0$, thereby enabling each first 2-input AND gate 301, 303, 305, 307, of each select gate 31, 32, 33, 34. As a result of the inverting input, each second 2-input AND gate 302, 304, 306, 308, is disabled. The output of OR gate 310, 311, 312, 313, is signal C,D, E, F, (which corresponds to input signals $A_1$, $A_2$, $A_3$, $A_4$) and delayed from control signal $S_0$ by two gate time delays and is coupled to the inputs of latches 320, 321, 322, 323, respectively.

At time $T_1$, $\overline{CLK}$ goes high and latches signals C, D, E, F, thereby outputing signals G, H, I, J, which forms the input signals to the second stage 20. Control signal $S_1$ is clocked by $\overline{CLK}$ via a control latch 209, which outputs a control signal $S_1'$ which is further coupled to the second input of each AND gate 201, 202, 203, 204, of each select gate 21, 22, of second stage 20. Since signal $S_1'$ is high AND gates 201, 203, are enabled thereby coupling signals G, I through OR gates 205, 206, yielding signals K, L (which correspond to signals G, I) and are delayed from signal $S_1'$ by two gate time delays.

At time $T_2$ signals K, L are latched in latches 207, 208 yielding output signals M, N, which also form the input signal to the first stage 10. Control signal $S_2$ is delayed by control latches 115, 116. Thus, when CLK goes high at time $T_2$, control signal $S_2'$, the output of the control latch 116, goes high and is coupled to one of the inputs of each of the two AND gates 111, 112, of select gate 11. In this example, since the output of control latch 116 is high, AND gate 111 is enabled thereby transmitting signal M to OR gate 113. Signal P, the output of OR gate 113 and which corresponds to signal M, is coupled to the input of latch 114. At time $T_{out}$ $\overline{CLK}$ goes high latching signal P and outputting the output signal $\phi$ which corresponds to input signal $A_1$, thereby selecting input signal $A_1$. The output signal selected is a function of the control signals and for the three stage pipeline multiplexer is as shown in Table 1.

TABLE 1

| $S_0$ | $S_1$ | $S_2$ | $\phi$ |
|---|---|---|---|
| 0 | 0 | 0 | $B_4$ |
| 1 | 0 | 0 | $A_4$ |
| 0 | 1 | 0 | $B_3$ |
| 1 | 1 | 0 | $A_3$ |
| 0 | 0 | 1 | $B_2$ |
| 1 | 0 | 1 | $A_2$ |
| 0 | 1 | 1 | $B_1$ |
| 1 | 1 | 1 | $A_1$ |

Thus it can be seen that each select gate selects one of two inputs signals to output. Each stage comprises $2^n/2$ select gates, each stage having $2^n$ inputs, where n is the stage number from 1 to N, and the number of initial input signals, m, is $2^N$. The delay through the pipeline multiplexer is N/2 clock cycles. It can further be seen that the present invention fixes the data delay to a known relationship to the clock period and once the initial bit of data is output, data is output in a continuous stream at the clock rate.

Figure 7:
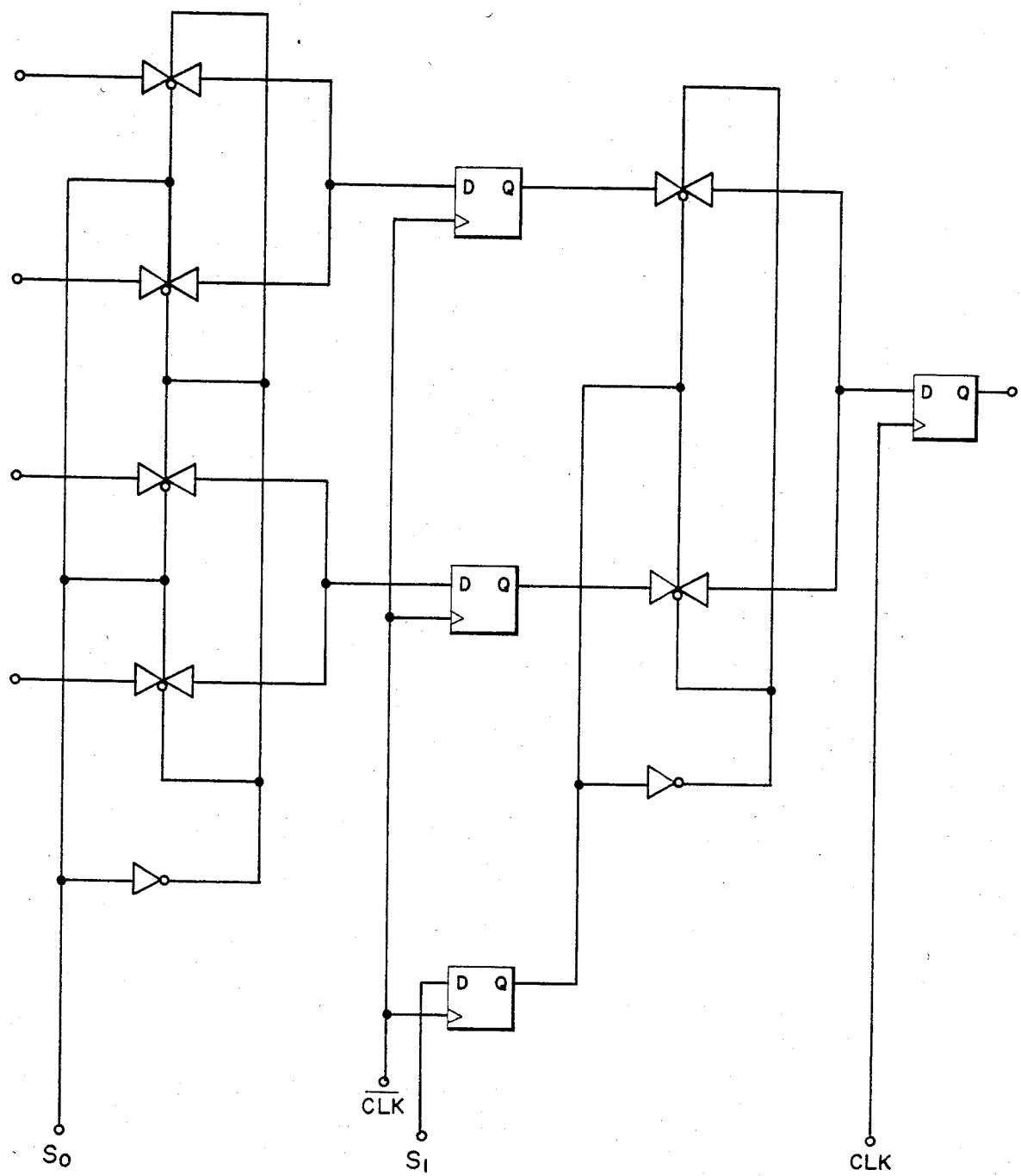
FIG. 7 shows a logic diagram of a two-stage pipeline of the present invention in static CMOS technology.
Figure 8:
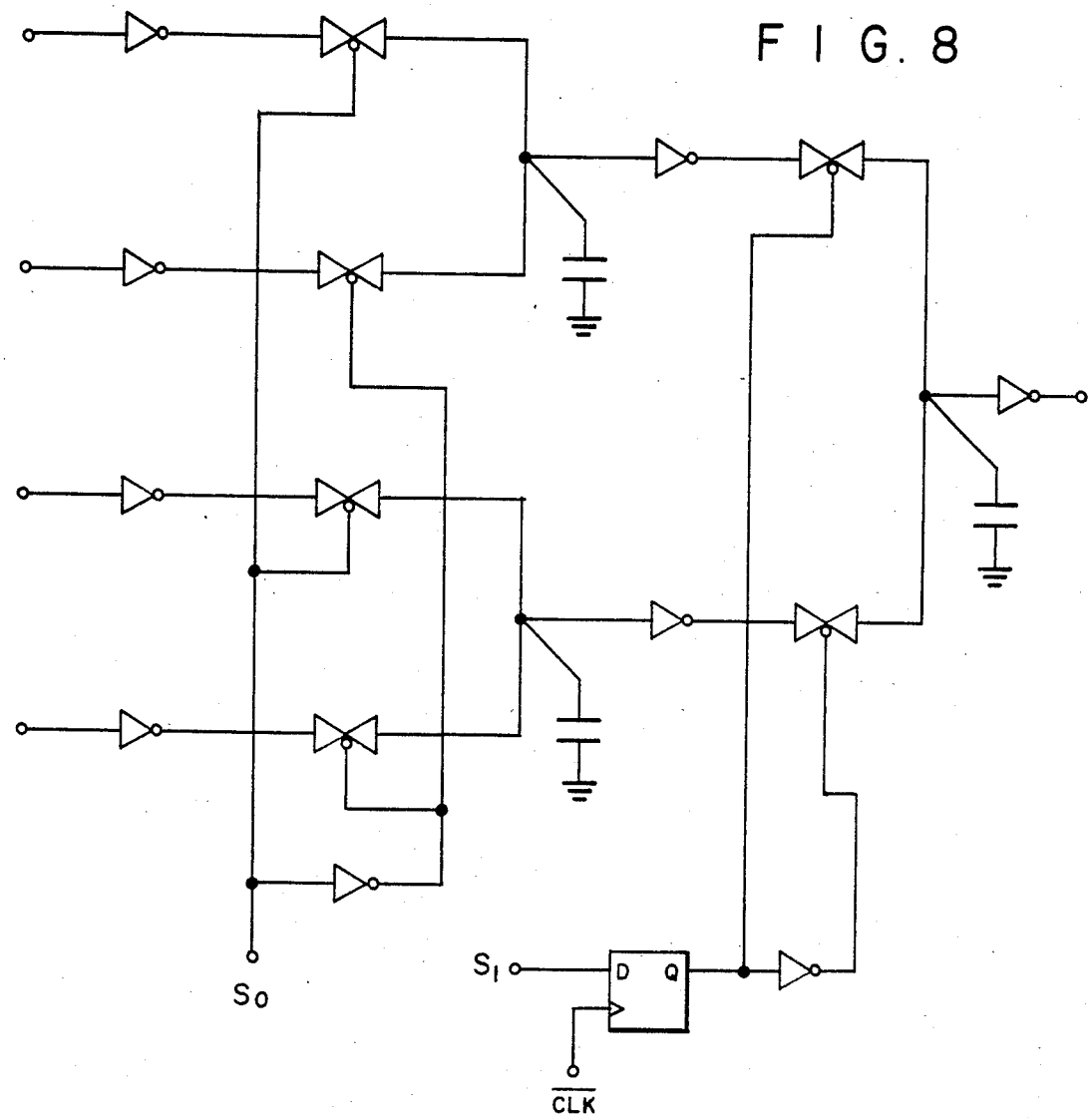
FIG. 8 shows a logic diagram of a two stage pipeline of the present invention in dynamic CMOS technology.
Figure 9:
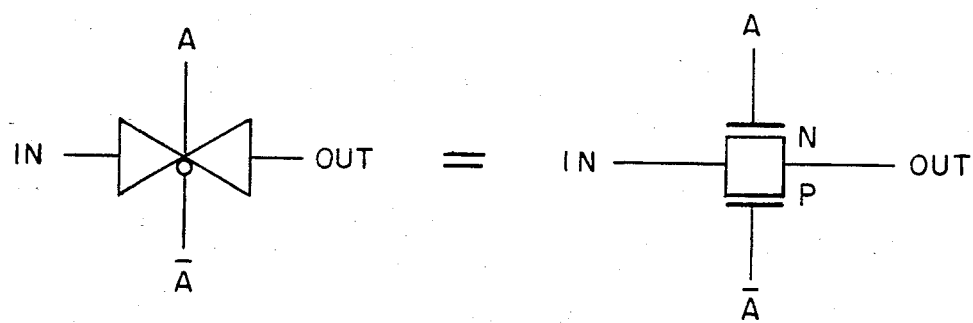
FIG. 9 shows an equivalent logic symbol for implementing the switching portion of the pipeline multiplexer of FIG. 7 in CMOS technology.

FIG. 7 shows a logic diagram of two-stage pipeline multiplexer of the present invention in static CMOS technology, FIG. 8 shows a logic diagram for implementing the pipeline multiplexer of the present invention in dynamic CMOS technology, and FIG. 9 shows the meaning of the symbolic CMOS transmission gate in terms of its N-channel and P-channel device connections.

While there has been shown what is considered to be the preferred enbodiment of the present invention, it will be manifest that many changes and modifications can be made therein without departing from the essential spirit and scope of the invention. It is intended, therefore, in the annexed claims, to cover all such changes and modifications which fall within the true scope of the invention.

We claim:
1. A pipelined multiplexer for selecting one-of-m initial input signals, comprising:
 (a) n stages of select elements, where n is the stage number from 1 to N, the Nth stage being an input stage and the first stage being an output stage, each stage of said select elements including:
 (b) $2^n/2$ select gate means, each select gate means having two input terminals adapted to receive an input signal and one output terminal, each select gate means for selecting one of two input signals from said input terminals to couple the selected input signal to said output terminal each select gate means of a predetermined stage of said select elements responsive to a select control signal, each output terminal of an ith stage of said select elements operatively connected to preselected input terminal of an i−1 stage of said select elements, where i is a whole number a value between N and 2 inclusive, the input terminals of said Nth stage of the select element each receiving one of the initial input signals, and the first stage of the select elements having a single output terminal thereby outputting the selected one-of-m initial input signals, each stage of said selected elements outputting their respective selected signals in response to a clocking signal, wherein each select gate means comprises:
 (i) selection means, having two input terminals each adapted to receive one of said input signals, for selecting one of the input signals coupled to said input terminals in response to the respective select control signal; and
 (ii) latch means, operatively connected to said selection means, for outputting the selected input signal in response to said clocking signal.

* * * * *